(12) United States Patent
Vemula

(10) Patent No.: US 7,360,132 B1
(45) Date of Patent: Apr. 15, 2008

(54) SYSTEM AND METHOD FOR MEMORY CHIP KILL

(75) Inventor: Sunil K. Vemula, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 499 days.

(21) Appl. No.: 11/134,773

(22) Filed: May 19, 2005

(51) Int. Cl.
*G11C 29/00* (2006.01)
(52) U.S. Cl. ........................ 714/723; 714/718
(58) Field of Classification Search ............ 714/7, 714/773, 766, 763, 723, 718
See application file for complete search history.

(56) References Cited

U.S. PATENT DOCUMENTS

| | | | | |
|---|---|---|---|---|
| 4,584,681 A | * | 4/1986 | Singh et al. ................ | 714/7 |
| 5,481,552 A | * | 1/1996 | Aldereguia et al. ......... | 714/773 |
| 5,623,506 A | * | 4/1997 | Dell et al. .................. | 714/766 |
| 6,493,843 B1 | * | 12/2002 | Raynham .................... | 714/763 |

OTHER PUBLICATIONS

IBM, "Memory Application of Multiple Bit Chips. Sep. 1981", IBM Disclosure Bulletin, vol. 24, pp. 2194-2196.*

* cited by examiner

*Primary Examiner*—David Ton
(74) *Attorney, Agent, or Firm*—Martine Penilla & Gencarella, LLP

(57) ABSTRACT

A memory interface comprising a first data input for receiving a data line to be stored in memory, a bad chip register containing a bad chip value for identifying a bad memory chip of a memory device to be used with the memory interface, and a write shift logic circuit receiving the data line from the first data input. The data line contains a plurality of data bits and a plurality of check bits, the check bits being logically appended to one end of the data bits. The write shift logic, in response to the bad chip value, causes a portion of the data line to be shifted toward the one end of the bad memory chip.

25 Claims, 4 Drawing Sheets

SYSTEM AND METHOD FOR MEMORY CHIP KILL

BACKGROUND

Computer memory is subject to errors caused by chip failure and ionizing radiation. Chip failure can result from manufacturing defects, voltage spikes, and combinations thereof. Randomly occurring memory errors caused by ionizing radiation are generally referred to as "soft errors." Various error correction codes are known and in use that detect and correct for soft errors. A well known error correction code is known as the Hamming code, which was published in 1950 by Richard Hamming. Error correction codes work by appending additional data onto a data segment, wherein the additional data contains sufficient information to detect and/or correct one or more errors in the data segment.

In computing systems, data is stored in main memory which generally comprises a plurality of memory chips which are accessed in parallel. Thus, reading 32 contiguous bits of data from memory in a single read operation could entail reading data from as many as 32 memory chips, with one bit being read from each chip. When one chip fails repeatedly, it can cause the corresponding bit in the read operation to be frequently erroneous. While the bit can generally be corrected using the error correction code applied for that data, it degrades the effectiveness of the error correction and could result in failing to correct legitimate soft errors, which in turn leads to instability of the system.

Previous attempts at resolving this issue have generally revolved around providing redundant or back-up memory devices. For example, a memory board may be on stand-by status and is activated by copying data from a failing memory board when a bad chip is detected. It is also known to kill a single chip and remap the memory to a stand-by or other chip using software or a hardware memory controller. However, previous systems were inefficient. Redundant systems required extra unused memory boards to be present. Previous memory remapping required extensive rerouting and management of memory in the memory controller on the processor silicon, which required expensive real estate on the processor.

There is therefore an unmet need for an improved memory chip kill system and method which does not require excessive processor real estate, is simple to implement, and transparent to the normal operation of the processor.

SUMMARY

Broadly speaking, the present invention fills these needs by providing a memory interface implementing memory chip kill functionality.

It should be appreciated that the present invention can be implemented in numerous ways, including as a process, an apparatus, a system, a device, or a method. Several inventive embodiments of the present invention are described below.

In one embodiment, a memory interface comprises a first data input for receiving a data line to be stored in memory, a bad chip register containing a bad chip value for identifying a bad memory chip of a memory device to be used with the memory interface, and a write shift logic circuit receiving the data line from the first data input. The data line contains a plurality of data bits and a plurality of check bits, the check bits being logically appended to one end of the data bits. The write shift logic, in response to the bad chip value, causes a portion of the data line to be shifted toward the one end of the bad memory chip.

In another embodiment, a method for memory chip kill includes receiving a data line to be stored in a target memory device, identifying a bad memory chip of the target memory device, and shifting a portion of the data line toward the one end of the data line when in a chip kill mode. The data line contains a plurality of data bits and a plurality of check bits, the check bits being logically appended to one end of the data bits.

In yet another embodiment, a method for memory chip kill includes receiving a data line, shifting a portion of the data line toward the one end of the data line when in a chip kill mode, receiving the shifted data, and unshifting the portion of the data line when in the chip kill mode. The data line contains a plurality of data bits and a plurality of check bits, the check bits being logically appended to one end of the data bits.

The advantages of the present invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

In the following description, numerous specific details are set forth in order to provide a thorough understanding of the present invention. However, it will be apparent to one skilled in the art that the present invention may be practiced without some of these specific details. In other instances, well known process operations have not been described in detail in order to avoid unnecessarily obscuring the invention.

Figure 1:
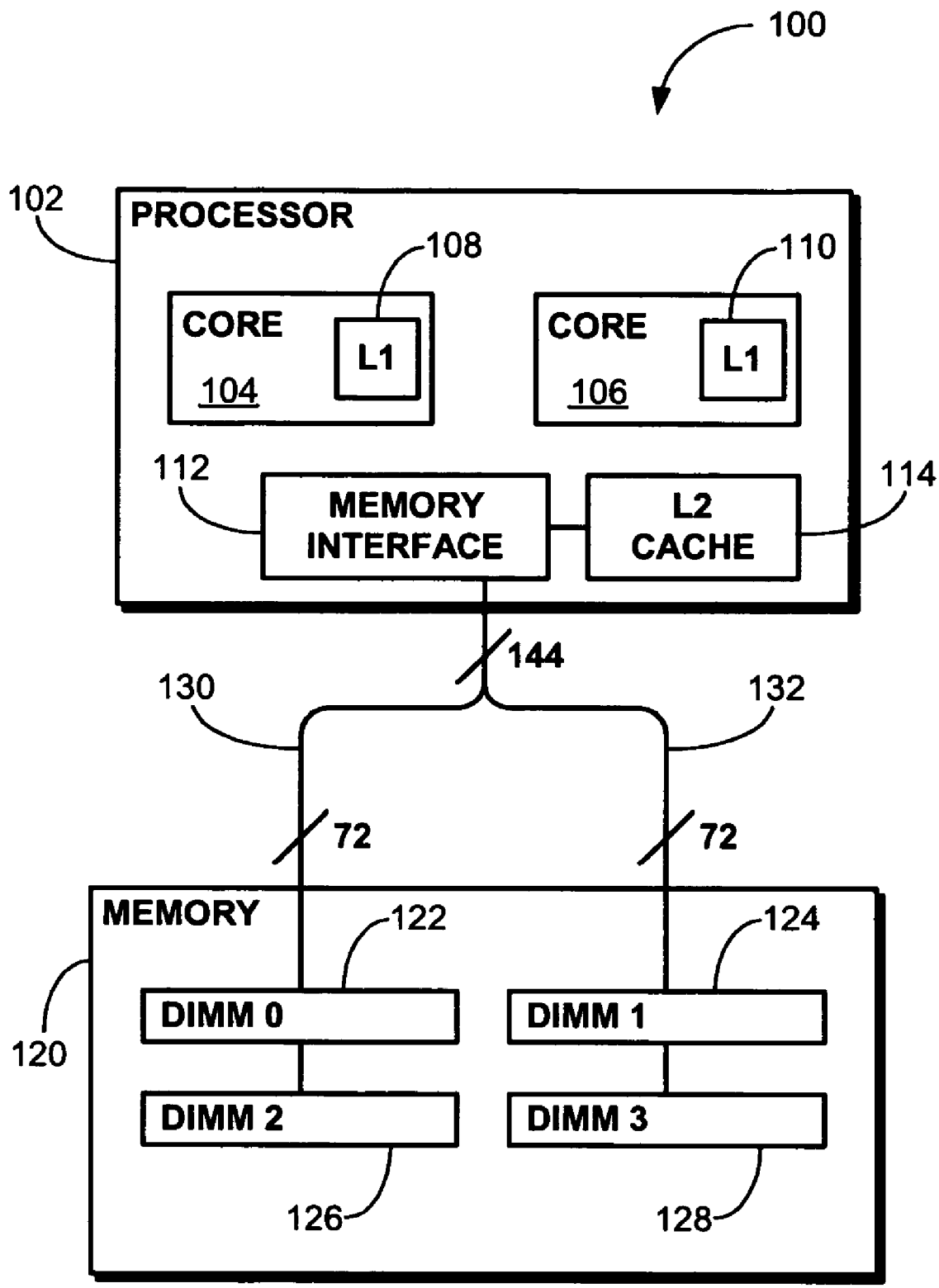
FIG. 1 shows a schematic representation of a computer system.

FIG. 1 shows a schematic representation of a computer system 100. Computer system 100 comprises a processor 102 and a main memory 120. Other known computer components may be present as would be understood by those skilled in the art. Processor 102 includes a first processing core 104 and a second processing core 106. Although two cores are shown, any number of processing cores may be present including only one core. Each processing core 104, 106 includes a respective level one (L1) cache. When one of the processing cores 104, 106 cannot find data located in the L1 cache, it will look in the level two (L2) cache 114 located on processor 102. If L2 cache 114 does not contain the requested data, then the data is loaded from main memory 120 via memory interface 112. Thus, L2 cache 114 may be shared by cores 104, 106. Alternatively, each core 104, 106, may have its own respective L2 cache. Memory interface 112 is shown as part of processor 102, however, it is also possible that memory interface 112 can exist on a separate integrated circuit. Other memory technologies, such as virtual memory wherein memory is swapped from main memory 120 to a mass storage device (not shown) may be provided as well.

In the exemplary embodiment, main memory 120 includes four dual in-line memory modules (DIMMs) 122, 124, 126, and 128. DIMMs 122 and 124 are accessed in parallel to provide 144 bits of data, with 72 bits being read out from each DIMM. Likewise, DIMMs 126 and 128 are accessed in parallel. Any number DIMMs accessible by processor 102 may be provided in this manner. It should be noted that while the exemplary embodiment shown provides access to two DIMMs in parallel with each DIMM reading out 72 bits at a time, other configurations are possible. Thus, the exemplary embodiment should be viewed as illustrative and not limiting.

Figure 2:
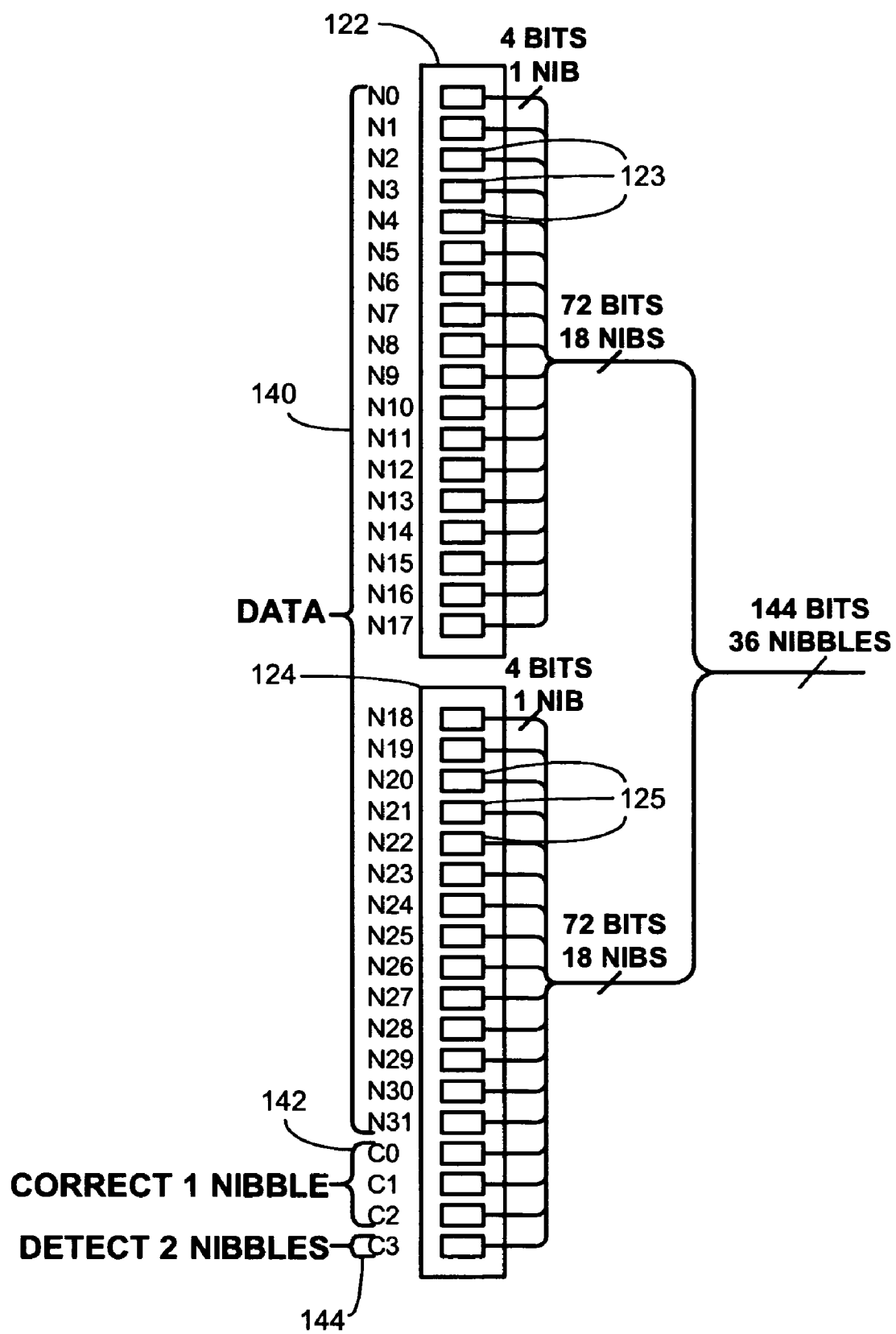
FIG. 2 schematically represents an exemplary organization of data within a pair of dual in-line memory modules.

FIG. 2 schematically represents DIMMs 122 and 124. DIMM 122 contains a plurality of memory chips 123 and DIMM 124 contains a plurality of memory chips 125. In one embodiment, each DIMM 122, 124 contains 18 memory chips. Each memory chip 123, 125 reads out 4 bits per chip for a total of 72 bits per DIMM.

In one embodiment, one nibble is defined as four bits. Thus, each memory chip reads out one nibble of data. Thus, chips 123 in DIMM 122 output nibbles N0 to N17 while fourteen of chips 125 in DIMM 124 output nibbles N18-N31. The four remaining chips in DIMM 124 output error correction nibbles C0-C3.

In one embodiment, error correction nibbles C0-C2 are encoded with information allowing correction of one of data nibbles N0-N31. Thus, when any number of bits in one of nibbles N0-N31 is wrong, an error correction algorithm can use data in nibbles C0-C2 to correct the nibble. Error correction nibble C3 contains data sufficient to detect when as many as two nibbles are erroneous.

Memory error correction codes capable of detecting and correcting errors in this manner are known. The following equations are modified for the particular memory configuration outlined above. Other memory configurations are contemplated and thus this configuration and these equations should be construed only as being exemplary and not limiting as to the invention.

In an exemplary embodiment, correction nibbles C0-C3 are calculated as shown below in Equations 1-4. Where "+" is an XOR operation and "*" is a modulo multiplication using primitive polynomial of value 10011.

$C0$ (4 bits)=$(N0+2*N1+3*N2+4*N3+5*N4+6*N5+$
$7*N6+8*N7+9*N8+10*N9+11*N10+12*N11+$
$13*N12+14*N13+15*N14+N15+2*N16+3*N17+$
$4*N18+5*N19+6*N20+7*N21+8*N22+9*N23+$
$10*N24+11*N25+12*N26+13*N27+14*N28+$
$15*N29+N37)\hat{\ }\{4\{addr\_parity\}\}$ [Eq. 1]

$C1$(4 bits)=$(N0+N1+N2+N3+N4+N5+N6+N7+N8+$
$N9+N10+N11+N12+N13+N14+N30+N31)$
$\hat{\ }\{4\{addr\_parity\}\}$ [Eq. 2]

$C2$ (4 bits)=$(N15+N16+N17+N18+N9+N20+N21+$
$N22+N23+N24+N25+N26+N27+N28+N29+$
$N30+N31)\hat{\ }\{4\{addr\_parity\}\}$ [Eq. 3]

$C3$ (4 bits)=$(N0+9*N1+14*N2+13*N3+12*N4+$
$7*N5+6*N6+15*N7+2*N8+12*N9+5*N10+$
$10*N11+4*N12+3*N13+8*N14+N15+9*N16+$
$14*N17+13*N18+11*N19+7*N20+6*N21+$
$15*N22+2*N23+12*N24+5*N25+10*N26+$
$4*N27+3*N28+8*N29+N30)\hat{\ }\{4\{addr\_parity\}\}$ [Eq. 4]

To solve for errors, four syndrome nibbles are calculated as follows:

$S0$(4 bits)=$(C0+N0+2*N1+3*N2+4*N3+5*N4+6*N5+$
$7*N6+8*N7+9*N8+10*N9+11*N10+12*N11+$
$13*N12+14*N13+15*N14+N15+2*N16+3*N17+$
$4*N18+5*N19+6*N20+7*N21+8*N22+9*N23+$
$10*N24+11*N25+12*N26+13*N27+14*N28+$
$15*29*N31)\hat{\ }\{4\{addr\_parity\}\}$ [Eq. 5]

$S1$(4 bits)=$(C1+N0+N1+N2+N3+N4+N5+N6+N7+$
$N8+N9+N10+N11+N12+N13+N14+N30+N31)$
$\hat{\ }\{4\{addr\_parity\}\}$ [Eq. 6]

$S2$(4 bits)=$(C2+N15+N16+N17+N18+N19+N20+$
$N21+N22+N23+N24+N25+N26+N27+N28+$
$N29+N30+N31)\hat{\ }\{4\{addr\_parity\}\}$ [Eq. 7]

$S3$(4 bits)=$(C3+N0+9*N1+14*N2+13*N3+11*N4+$
$7*N5+6*N6+15*N7+2*N8+12*N9+5*N10+$
$10*N11+4*N12+3*N13+8*N14+N15+9*N16+$
$14*N17+13*N18+11*N19+7*N20+6*N21+$
$15*N22+2*N23+12*N24+5*N25+10*N26+$
$4*N27+3*N28+8*N29+N30)\hat{\ }\{4\{addr\_parity\}\}$ [Eq. 8]

Upon calculating the above syndrome nibble values S0 to S3, the equivalent of the following pseudocode can be executed in hardware to correct any one error:

```
If (s2 == 0 && s1 != 0 && s0 != 0), then {
    nibble_to_correct=(s0/s1-1);
    corrected_data = s1 + N[nibble_to_correct]
}
If s1 == 0 && s0 != 0 && s2 != 0, then {
    nibble_to_correct = (s0/s2 + 14);
    corrected_data = s2 + N[nibble_to_correct]
}
If (s0 == 0 && s1 != 0 && s2 != 0 && s1 == s2), then {
    nibble_to_correct = 30;
    corrected_data = s1 + N30;
}
If (s0!=0 && s1 != 0 && s2 != 0 && s0==s1==s2), then {
    nibble_to_correct = 31;
    corrected_data = s1 + N31;
}
```

The syndrome nibble S3 is used to detect the presence of multiple errors. A double error is indicated when (1) exactly two of the check-nibbles are non-zero, or (2) all four of the check-nibbles are non-zero, or (3) the nibble position as indicated by S0/S1 or S0/S2 does not match the nibble position as indicated by S3/S1 or S3/S2, or (4) S1 and S2 are non-zero, and the non-zero check-nibbles are not all equal.

In one embodiment of a chip kill implementation, the functionality of the chip containing check nibble C3 is eliminated to free up a memory chip to store data that would otherwise be stored in a bad chip. The implementation relies on shift logic which will now be described in detail.

Figure 3:
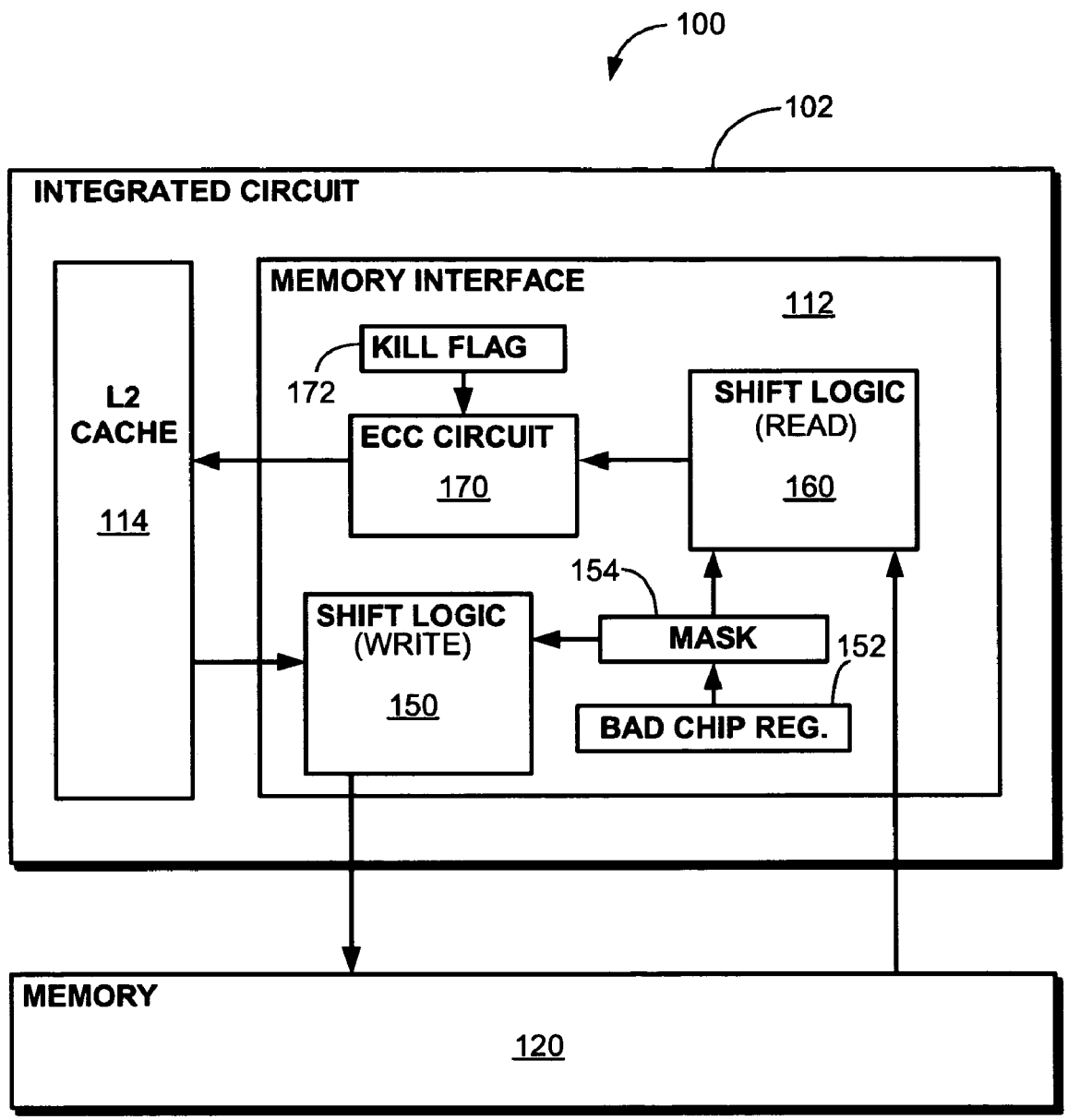
FIG. 3 shows another schematic representation of an exemplary computer system.

FIG. 3 shows another schematic representation of exemplary computer system 100. Information to be written to main memory 120, e.g., during a write back operation from L2 cache 114, passes through write shift logic 150. Exemplary write shift logic 150 is shown in detail in FIG. 4. For N number of memory chips or nibbles, write shift logic 150 comprises N-1 number of multiplexers, numbered X0, X1, X2, etc. Although one multiplexer is shown for each nibble, it will be understood that there will actually be four multiplexers operating in parallel for each four-bit nibble. Each multiplexer receives one bit of a mask register M(1)-M(34) as its select signal. The bits are identified as M(0) as the first bit of the mask register, M(1) for the second bit, etc. During normal operation, the mask register is zero and so all of the multiplexers in write shift logic 150 receive zero for the select signal. This causes each incoming data nibble to be passed straight through to its corresponding memory chip.

Thus, nibble N0 is stored in chip 0, nibble N1 is stored in chip 1, etc. The check nibbles are stored in their corresponding memory chips as well, so that check nibble C0 is stored in chip 32, nibble C1 is stored in chip 33, nibble C2 is stored in chip 34 and nibble C3 is stored in chip 35.

Referring back to FIG. 3, when operating system or other memory management software or hardware subsystem (not shown) determines that one chip may be bad, e.g., by determining that one particular nibble is frequently erroneous, it will set a kill flag 172 to TRUE and identify the bad chip by setting a corresponding bit in the bad chip register 152. A mask 154 is created in software from the bad chip register whereby each bit of the mask is set to zero except for the bit corresponding to the bit in bad chip register 152 and every bit thereafter. For example, Table 1 shows the contents of bad chip register 152 and mask 154 when chip 9 is bad.

TABLE 1

Mask Example

| BAD CHIP REGISTER | 0000000000000000000000001000000000 |
|---|---|
| MASK | 1111111111111111111111111000000000 |

Figure 4:
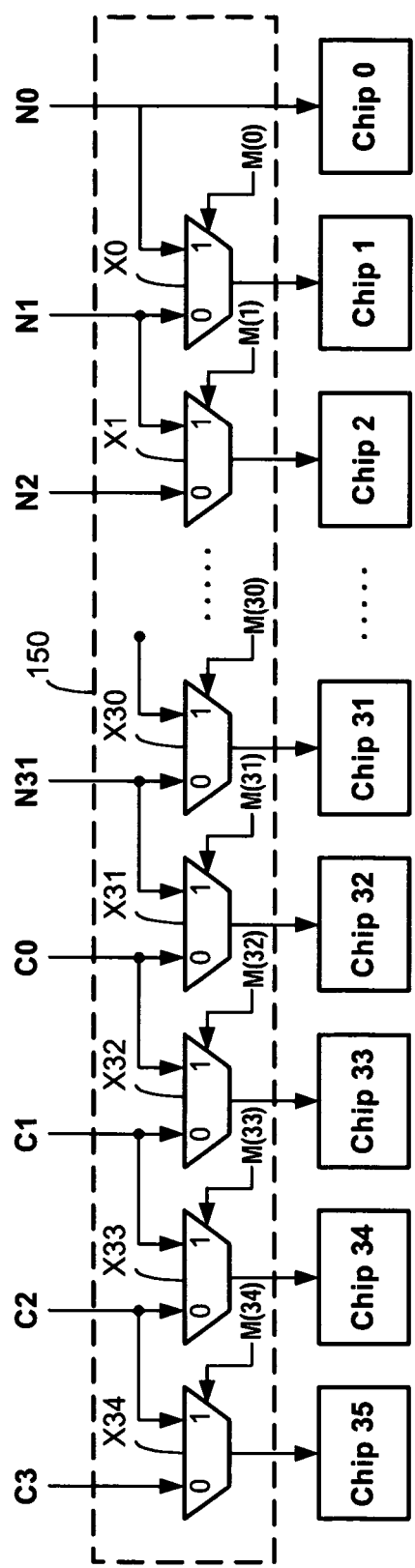
FIG. 4 shows exemplary write shift logic.

Each bit of the mask is applied as the select signal for the corresponding multiplexer X0-X34. Referring to FIG. 4, if chip 1 is bad, then the mask would comprise a 0 in the least significant bit and 1s in the remaining bits. Nibble N0 will be passed to chip 0 and input "1" of multiplexer X0. However, since the first bit of the mask, i.e., bit M(0), is zero, this input is ignored. Nibble N1 is passed to the "0" input of multiplexer X0 and the "1" input of the multiplexer X1. Since multiplexer X0 receives a select signal of 0 and multiplexer X1 receives a select signal of 1, nibble N1 is passed to both of chips 1 and 2. Since all the remaining multiplexers receive 1s from the mask, nibble N2 is passed to chip 3 (not shown) only, nibble N3 (not shown) is passed to chip 4 (not shown) only, etc. Finally, nibble C2 is passed to chip 35 by multiplexer X34 and nibble C3 is lost. Thus, write shift logic 150 shifts information that would be stored in a bad chip and every chip after the bad chip to the next higher chip.

Figure 5:
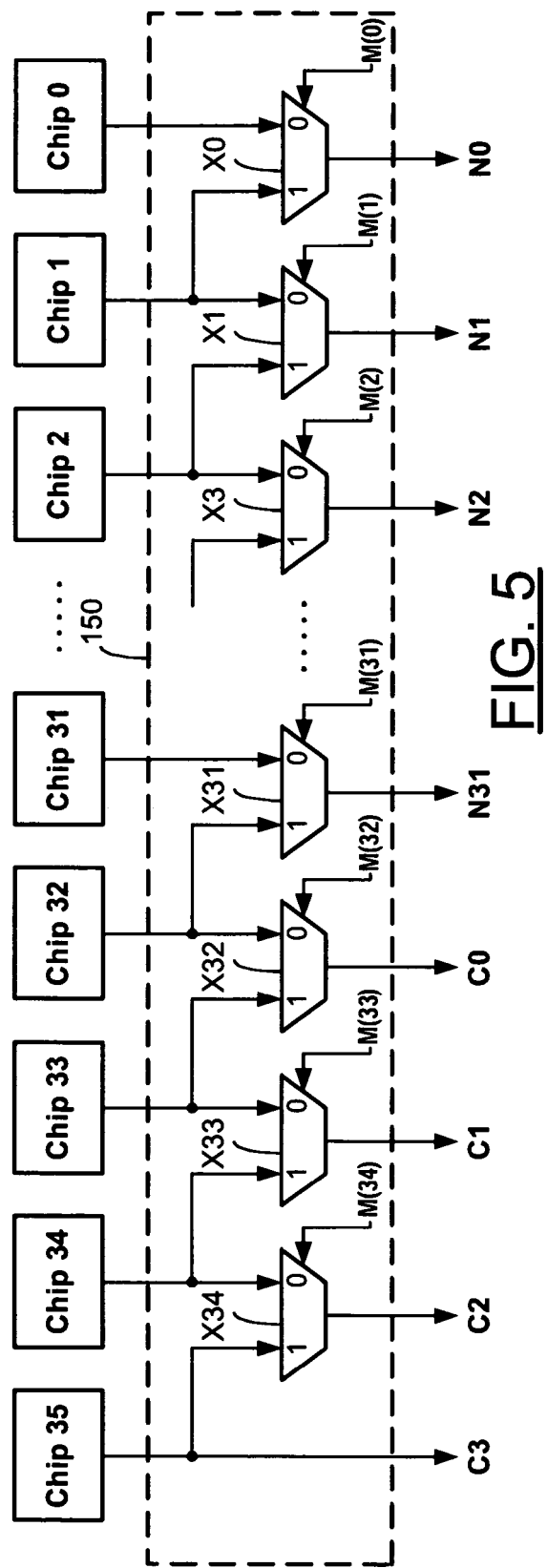
FIG. 5 shows exemplary read shift logic.

Referring to FIG. 3 again, during a read operation, data, along with the check nibbles, is retrieved from main memory 120 and, in one embodiment, first arrives at read shift logic 160. Read shift logic 160 is shown in detail in FIG. 5, wherein each chip outputs a nibble of information which is received by multiplexers X0 through X34. The data is shifted in accordance with select signals to each multiplexer which corresponds to a bit in mask 154 derived from bad chip register 152 as described previously. In this manner, read shift logic 160 performs the reverse operation of write shift logic 150. To continue with the example mentioned previously where chip 1 is bad, M(0) is zero, thereby reading out nibble N0 from chip 0 and M(1) is 1, thereby reading out nibble N1 from chip 2. Data from bad chip 1 is lost. At the other end, data from chip 35 is output as both check nibble C2 and check nibble C3.

As shown in FIG. 3, after being shifted by read shift logic 160, data read from memory 120 passes through ECC circuit 170. In one embodiment, ECC circuit performs the algorithm mentioned above to determine if any nibble is bad, and if so, to correct it. If Kill flag 172 indicates that the memory is operating in chip kill mode, then check nibble C3 is ignored and no further error correction is performed. However, if kill flag 172 indicates that the memory is operating in a normal mode, then ECC circuit 170 will check for double errors using nibble C3.

Thus, when a chip is bad, it generates a bad nibble which is correctible by ECC circuit 170. If any additional soft error occurs, however, it cannot be corrected without entering the chip kill mode. Once the chip kill mode is entered, the bad chip is bypassed and any soft error that occurs is correctible using check nibbles C0-C2.

As mentioned, in one embodiment, responsibility for determining when chip kill mode is entered, and for setting kill flag 172 and the bit in bad chip register 152 corresponding to the bad chip rests with software. In one embodiment in particular, the operating system will monitor logged soft errors, and when one nibble is repeatedly bad, i.e., logs an error at a frequency above a selected threshold frequency, the operating system enters chip kill mode by setting kill flag 172 and bad chip register 152 is set by hardware to identify the bad chip. When entering chip kill mode, the entire contents of DIMM 122 and DIMM 124 (FIG. 2) is read out without shifting, i.e., bypassing shift logic 160, (FIG. 3) passed through ECC circuit 170, shifted using write shift logic 150, and finally stored back in memory 120. Thereafter, use of the bad memory chip is avoided and all memory reads pass through read shift logic 160 to undo the shifting caused by write shift logic 160.

Note that, while the presently described embodiments are specific as to many details, it would be within the scope of the invention to modify these details while still retaining the spirit and scope of the invention. For example, it would be possible to append the error correction code adjacent the least significant nibble rather than the most significant nibble and shift the data in a direction opposite that shown in FIGS. 4 and 5. Likewise other modification will doubtless occur to those skilled in the art.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Embodiments of the present invention can be processed on a single computer, or using multiple computers or computer components which are interconnected. A computer, as used herein, shall include a standalone computer system having its own processor(s), its own memory, and its own storage, or a distributed computing system, which provides computer resources to a networked terminal. In some distributed computing systems, users of a computer system may actually be accessing component parts that are shared among a number of users. The users can therefore access a virtual computer over a network, which will appear to the user as a single computer customized and dedicated for a single user.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory interface comprising:
a first data input for receiving a data line to be stored in memory, the data line containing plurality of data bits and a plurality of check bits, the check bits being logically appended to one end of the data bits;
a bad chip register containing a bad chip value for identifying a bad memory chip of a memory device to be used with the memory interface;
a write shift logic circuit receiving the data line from the first data input, wherein the write shift logic, in response to the bad chip value, causes a portion of the data line to be shifted toward the one end of the bad memory chip.

2. The memory interface of claim 1 wherein each memory chip of the memory device stores a plurality of bits of the data line.

3. The memory interface of claim 2 wherein the write shift logic shifts the portion of the data line a number of bits sufficient so that each bit is shifted to a next one of the memory chips.

4. The memory interface of claim 2 wherein said each memory chip stores a nibble of bits of the data line, a nibble comprising four bits.

5. The memory interface of claim 1 wherein the bad chip register contains a bit corresponding to each memory chip of the memory device to be used with the memory interface, wherein, in a chip kill mode, a bit of the bad chip register corresponding the bad memory chip is set.

6. The memory interface of claim 5 further comprising a mask register, the mask register containing a bit corresponding to said each memory chip, the mask register containing a mask value wherein a bit set in the bad chip register causes a corresponding bit in the mask register and all bits to one side of the corresponding bit to be set.

7. The memory interface of claim 6 wherein the write shift logic comprises a plurality of multiplexers, each multiplexer receiving a select signal that depends upon one of the bits of the mask value.

8. The memory interface of claim 1 wherein the data line arranges bits from a least significant bit to a most significant bit and the error correction bits are logically appended adjacent the most significant bits.

9. The memory interface of claim 8 wherein one or more bits of the data line corresponding to a last memory chip contains data sufficient to identify a presence or absence of errors in bits corresponding to two of the memory chips.

10. The memory interface of claim 1 further comprising:
a second data input for receiving data from the memory device; and
a read shift logic for unshifting data shifted by the write shift logic, the read shift logic performing the unshifting in response to the bad chip value.

11. The memory interface of claim 10 further comprising an error correction code circuit for applying an error correction code algorithm to the data line after being unshifted by the read shift logic.

12. The memory interface of claim 11 wherein, in a normal mode, the error correction code circuit applies a first portion of the error correction bits to correct a first number of bits of the data line and a second portion of the error correction bits to detect a second number of bits of the data line, the second number being greater than the first number, and in a chip kill mode, only applies the first portion of the error correction bits to correct the first number of bits.

13. The memory interface of claim 12 wherein the first portion of the error correction bits provides information sufficient to correct any number of erroneous bits of the data line stored by one memory chip, and the second portion of the error correction bits provides information sufficient to detect when errors exist in as many as two memory chips.

14. A method for memory chip kill, the method comprising:
receiving a data line to be stored in a target memory device, the data line containing plurality of data bits and a plurality of check bits, the check bits being logically appended to one end of the data bits;
identifying a bad memory chip of the target memory device;
shifting a portion of the data line toward the one end of the data line when in a chip kill mode.

15. The method claim 14 wherein each memory chip of the target memory device stores a plurality of bits of the data line.

16. The method of claim 15 wherein the shifting comprises shifting the portion of the data line a number of bits sufficient so that each bit is shifted to a next memory chip.

17. The method of claim 14 further comprising setting a bit of a bad chip register, the bit corresponding to the bad memory chip of the target memory device.

18. The method of claim 17 further comprising a generating a mask value from the bad chip register such that a bit set in the bad chip register causes a corresponding bit in the mask register and all bits to one side of the corresponding bit to be set.

19. The method of claim 18 wherein the shifting further comprises receiving the mask value and shifting each bit in the data line when a corresponding bit in the mask value is set.

20. The method of claim 14 wherein one or more bits of the data line corresponding to a last memory chip contains data sufficient to identify a presence or absence of errors in bits corresponding to two of the memory chips.

21. The method of claim 14 further comprising:
receiving data from the memory device; and
unshifting the portion of the data line when in the chip kill mode.

22. The method of claim 21 further comprising applying an error correction code algorithm to the data line after being unshifted.

23. The method of claim 22 wherein, in a normal mode, applying a first portion of the error correction bits to correct a first number of bits of the data line and a second portion of the error correction bits to detect when a second number of bits of the data line are erroneous, the second number being greater than the first number, and in the chip kill mode, only applying the first portion of the error correction bits to correct the first number of bits.

24. The method of claim 23 wherein the first portion of the error correction bits provides information sufficient to correct any number of erroneous bits of the data line stored by one memory chip, and the second portion of the error correction bits provides information sufficient to detect when errors exist in as many as two memory chips.

25. A method for memory chip kill, the method comprising:
- receiving a data line containing plurality of data bits and a plurality of check bits, the check bits being logically appended to one end of the data bits;
- shifting a portion of the data line toward the one end of the data line when in a chip kill mode;
- receiving the shifted data; and
- unshifting the portion of the data line when in the chip kill mode.

* * * * *